US009620399B2

(12) United States Patent
Tanimura et al.

(10) Patent No.: US 9,620,399 B2
(45) Date of Patent: Apr. 11, 2017

(54) LOAD PORT

(71) Applicant: Hirata Corporation, Shinagawa (JP)

(72) Inventors: Hidenobu Tanimura, Kudamatsu (JP); Minoru Soraoka, Kudamatsu (JP); Shinji Yokoyama, Shinagawa (JP); Noriyoshi Toyoda, Shinagawa (JP)

(73) Assignee: HIRATA CORPORATION, Shinagawa, Tokyo (JP)

( * ) Notice: Subject to any disclaimer, the term of this patent is extended or adjusted under 35 U.S.C. 154(b) by 80 days.

(21) Appl. No.: 14/622,973

(22) Filed: Feb. 16, 2015

(65) Prior Publication Data
US 2015/0162229 A1 Jun. 11, 2015

Related U.S. Application Data

(63) Continuation of application No. 11/405,421, filed on Apr. 18, 2006, now abandoned.

(51) Int. Cl.
*H01L 21/677* (2006.01)
*H01L 21/67* (2006.01)

(52) U.S. Cl.
CPC .. *H01L 21/67775* (2013.01); *H01L 21/67017* (2013.01); *H01L 21/67772* (2013.01)

(58) Field of Classification Search
CPC ......... H01L 21/67763; H01L 21/67772; H01L 21/67775; H01L 21/67017
See application file for complete search history.

(56) References Cited

U.S. PATENT DOCUMENTS

| | | | |
|---|---|---|---|
| 4,704,348 A | 11/1987 | Koizumi et al. | |
| 4,786,947 A | 11/1988 | Kosugi et al. | |
| 6,013,920 A | 1/2000 | Gordon et al. | |
| 6,470,927 B2 | 10/2002 | Otaguro | |
| 6,543,981 B1 | 4/2003 | Halsey et al. | |
| 6,642,533 B2 | 11/2003 | Haraguchi et al. | |
| 6,817,822 B2 | 11/2004 | Tokunaga | |
| 6,895,981 B2 | 5/2005 | Dolechek et al. | |
| 6,896,470 B1 | 5/2005 | Chen et al. | |
| 6,984,839 B2 | 1/2006 | Igarashi et al. | |
| 7,468,099 B2 | 12/2008 | Katayama | |
| 7,654,291 B2 * | 2/2010 | Miyajima | H01L 21/67017 141/4 |
| 9,010,384 B2 * | 4/2015 | Yoshimura | H01L 21/67772 141/63 |
| 9,536,765 B2 * | 1/2017 | Iwamoto | H01L 21/67772 |

(Continued)

FOREIGN PATENT DOCUMENTS

JP 2004-165458 A 6/2004

*Primary Examiner* — Kaitlin Joerger
(74) *Attorney, Agent, or Firm* — Buchanan Ingersoll & Rooney PC

(57) ABSTRACT

A load port is provided with a table and a plate. The table is arranged on a side of a front wall of an atmospheric transfer unit for transferring a piece of material under processing and is adapted to mount on it a container with the piece of material received in the same. The plate serves to isolate an interior of the atmospheric transfer unit from an exterior of the atmospheric transfer unit. The load port includes an exhaust duct arranged on a rear side of the plate and a fan arranged in a lower extremity of the exhaust duct. By the exhaust duct and the fan, an internal atmosphere of the atmospheric transfer unit can be exhausted into the atmosphere.

13 Claims, 4 Drawing Sheets

(56) References Cited

U.S. PATENT DOCUMENTS

| | | | |
|---|---|---|---|
| 2003/0111071 A1 | 6/2003 | Perrault | |
| 2003/0198541 A1* | 10/2003 | Davis | H01L 21/67173 414/217 |
| 2004/0191545 A1* | 9/2004 | Han | C23C 16/4404 428/472 |
| 2006/0204356 A1 | 9/2006 | Yamagishi et al. | |
| 2009/0129897 A1* | 5/2009 | Babbs | H01L 21/67201 414/217 |
| 2013/0042945 A1* | 2/2013 | Emoto | H01L 21/67017 141/98 |

* cited by examiner

LOAD PORT

FIELD OF THE INVENTION

This invention relates to a load port suitable for arrangement in a semiconductor fabrication facility, and especially to a load port suitable for arrangement in combination with an atmospheric transfer unit in a semiconductor fabrication facility to handle a container with at least one, generally plural pieces of material such as semiconductor wafers received therein either before or after their processing.

DESCRIPTION OF THE BACKGROUND

In a semiconductor fabrication process, at least one, generally plural pieces of material such as semiconductor wafers (hereinafter simply called "semiconductor wafers" for the sake of brevity) under processing are placed in a container called "FOUP" (Front Opening Unified Pod) or "FOSB" (Front Opening Shipping Box), and are transferred in a substantially-sealed state to a semiconductor fabrication facility by a transfer apparatus.

Until the semiconductor wafers are transferred to a processing chamber in the semiconductor fabrication facility, they are maintained out of contact with the external air. Upon processing, they are taken out of the container by an atmospheric transfer unit such as an atmospheric transfer robot, and are moved into the processing chamber via a transfer chamber.

The atmospheric transfer unit in the semiconductor fabrication facility is, therefore, equipped with a handling apparatus called "load port". While maintaining them in the substantially sealed state, this load port makes it possible to take the semiconductor wafers out of the container, for example, an FOUP and to transfer them into the processing chamber of the semiconductor fabrication facility, so that in the processing chamber, processing is applied to the semiconductor wafers as needed.

As appreciated from the foregoing, a load port is an apparatus equipped with a function and structure required to bring the interior of a semiconductor fabrication facility into communication with a container and then to take semiconductor wafers out of the container or to place semiconductor wafers in the container while sealing the container from the exterior, and is known conventionally (see, for example, JP-A-2004-165458).

The above-described conventional load ports are, however, configured without taking into consideration a pressure difference between an internal atmosphere of a container and that of a semiconductor fabrication facility. As soon as a door of a load port is opened to bring the interiors of the container and semiconductor fabrication facility into communication with each other, the internal atmosphere of the semiconductor fabrication facility flows into the container due to the pressure difference, thereby developing a problem that particles are carried into the container from a drive unit for the door, an atmospheric transfer robot and the like and deposit on semiconductor wafers to contaminate them.

With a view to eliminating the above-described problem, some other conventional load ports are known to include a fan arranged in an upper or lower part of a transfer chamber as a space through which semiconductor wafers are transferred inside a semiconductor fabrication facility. Even with such a conventional load port, however, it is difficult to produce an air stream to such an extent as reaching inside a container such as an FOUP arranged on the load port. When processing is performed with corrosive gas within the semiconductor fabrication facility, there is a potential problem that the load port may be caused to corrode around the container.

Conventionally-known load ports also include those of the construction that a drive chamber, in which a drive actuator for opening or closing a door of each load port is accommodated, is isolated from a transfer chamber by a partition plate and the partition plate is provided with guide slots to permit movements of a member by which the door itself or a carrier connected to the carrier and the drive chamber are linked to each other. These conventional load ports, however, involve a potential problem that corrosive gas existing in the transfer chamber enters the drive chamber through the slots and may cause corrosion of the carrier around its part connected to the above-mentioned member and also corrosion of the drive actuator to produce particles. There is another problem that such particles may deposit on semiconductor wafers. With respect to these potential problems, no consideration was taken in the above-described conventional art.

SUMMARY OF THE INVENTION

An object of the present invention is, therefore, to provide a load port for the transfer of at least one, generally plural pieces of material such as semiconductor wafers, which is practically free of the potential problem of corrosion development or the potential problem of deposition of particles.

In one aspect of the present invention, there is thus provided a load port provided with a table arranged on a side of a front wall of an atmospheric transfer unit for transferring a piece of material under processing and adapted to mount thereon a container with the piece of material received therein, and a plate for isolating an interior of the atmospheric transfer unit from an exterior of the atmospheric transfer unit. The load port comprises an exhaust duct arranged on a rear side of the plate, and a fan arranged in a lower extremity of the exhaust duct. By the exhaust duct and the fan, an internal atmosphere of the atmospheric transfer unit can be exhausted into the atmosphere.

By the exhaust duct and the fan, an internal atmosphere of the container may also be exhausted to the exterior of the atmospheric transfer unit.

In another aspect of the present invention, there is also provided a load port provided with a table arranged on a side of a front wall of an atmospheric transfer unit for transferring a piece of material under processing and adapted to mount thereon a container with the piece of material received therein, a plate for isolating an interior of the atmospheric transfer unit from an exterior of the atmospheric transfer unit, an opening formed in the plate to permit taking the piece of material out of the container or placing the piece of material in the container, and an accommodation chamber arranged on a side of the front wall of the atmospheric transfer unit and accommodating therein a drive unit for driving a door that opens or closes the opening of the plate. The load port comprises an exhaust duct arranged on a rear side of the plate, and a fan arranged in a lower extremity of the exhaust duct. By the exhaust duct and the fan, an internal atmosphere of the accommodation chamber can be exhausted to the exterior of the atmospheric transfer unit.

By the exhaust duct and the fan, an internal atmosphere of the container may be exhausted to the exterior of the atmospheric transfer unit as mentioned above. A corrosion preventive coating may, therefore, be applied to at least one of a surface of the exhaust duct, a surface of the fan, and a door carrier with the door supported thereon. In addition, the load port may further comprise a closure plate arranged between the door, which has moved to open the opening, and the plate, which isolates the interior of the atmospheric transfer unit and the exterior of the atmospheric transfer unit from each other, such that an interior atmosphere of the atmospheric transfer unit is prevented from flowing into the accommodation chamber.

As described above, the conventional art is accompanied by the problem that, when the door of the load port is opened, deposition of particles and corrosion take place inside the container, in the vicinities of the place where the container is arranged, and also on the door drive unit. According to the present invention, however, an air stream can be produced inside the container such as an FOUP without production of turbulence within the atmospheric transfer unit, and hence, particles and corrosive gas can be carried away from the inside and vicinities of the container and the surface and vicinities of the door drive unit. The present invention can, therefore, lessen or resolve the above-mentioned problems of the conventional art.

Further, the present invention makes it possible to lessen or resolve the above-described problems of the conventional art without requiring any substantial additional cost because it is unnecessary to additionally arrange any large equipment, for example, to additionally arrange a local ventilator in the transfer chamber.

DETAILED DESCRIPTION OF THE INVENTION AND PREFERRED EMBODIMENT

Figure 1:
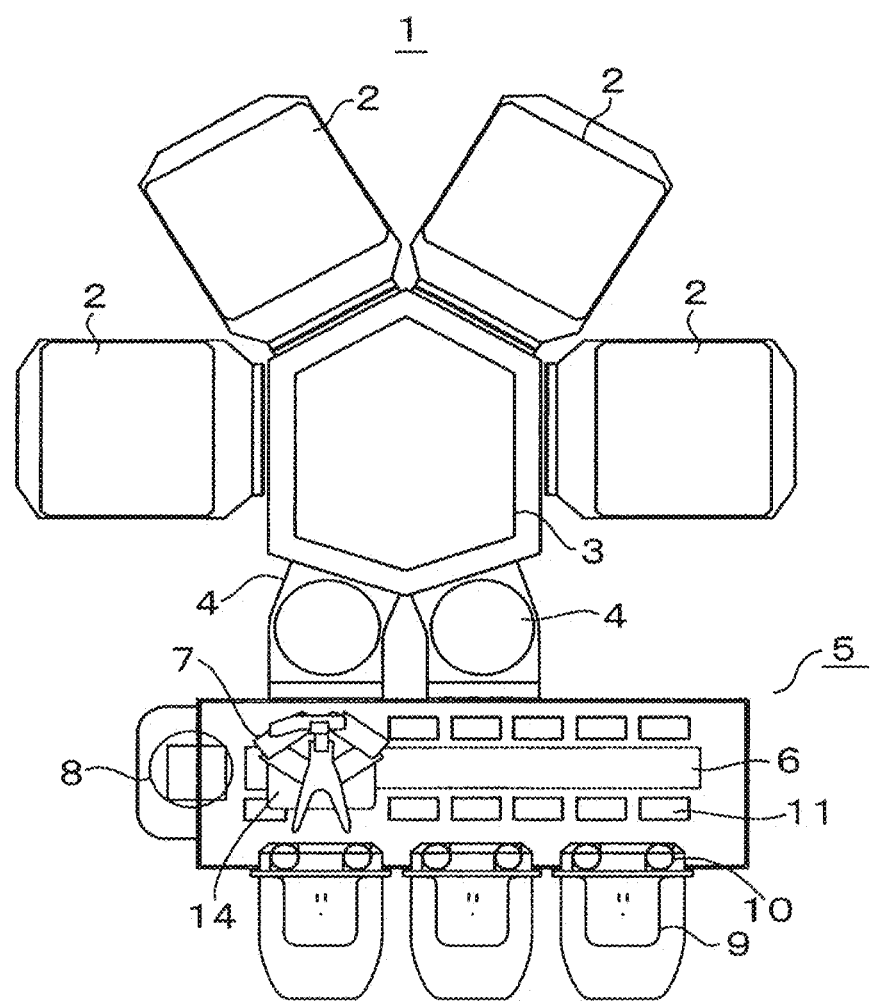
FIG. 1 is a top plan view showing the outline of a semiconductor processing system equipped with a plurality of load ports according to one embodiment of the present invention.

Based on the embodiment illustrated in the accompanying drawings, the load port according to the present invention will be described in more detail. In FIG. 1, a semiconductor processing system 1 is divided into a processing block on an upper side and an atmospheric block on a lower side thereof as viewed in the drawing. On the side of the processing block, there are plural processing chambers 2 for processing pieces of material, for example, semiconductor wafers (hereinafter simply called "semiconductor wafers". A buffer chamber 3 is arranged in communication with the processing chambers 2. On the side of the atmospheric block, there are two load-lock chambers 4, via which an atmospheric transfer unit 5 can be brought into communication with the buffer chambers 3.

The buffer chamber 3 is configured to have a substantially hexagonal shape in plan as viewed from the above. On the individual sides of the buffer chamber 3, the processing chambers 2 and load-lock chambers 4 are arranged, respectively, such that the processing chambers 2 and load-lock chambers 4 can be brought into communication with an interior of the buffer chamber 3.

Upon processing, the interiors of the processing chambers 2 are depressurized, processing gas is fed into the processing chamber 2, and the semiconductor wafers are processed with the gas. In the illustrated semiconductor processing system 1, the processing chambers 2 are arranged as many as four, and gas with a corrosive element such as chlorine contained therein can be fed into these processing chambers 2.

On the atmospheric side (lower side) of the atmospheric transfer unit 5, a plurality of load ports 9 are arranged. It is to be noted that in FIG. 1, the atmospheric transfer unit 5 is shown in cross-section to illustrate its internal construction.

Within the atmospheric transfer unit 5, a Y-axis unit 6 is arranged to permit movements of an atmospheric transfer robot 14 alongside a direction in which the plural load ports 9 are arranged side by side. This atmospheric transfer robot 14 is provided with a robot arm 7 which holds and transfers each semiconductor wafer. On a side of the atmospheric transfer unit 5, an alignment unit 8 is arranged to permit positional and directional adjustments of the robot arm 7 relative to each semiconductor wafer.

Each load port 9 is provided in an upper part thereof with an opening and a door for selectively opening or closing the opening. After a container 15 (see FIG. 2) is mounted at a position of a predetermined height, the door is opened to bring the interior of the container 15 and the internal space of the atmospheric transfer unit 5 into communication with each other in a state that the interior of the container 15 is maintained sealed from the exterior.

At this time, the associated load-lock chamber 4 is located between the atmospheric transfer unit 5 and the buffer chamber 3, and serves to permit a transfer of the semiconductor wafer under reduced pressure between a wafer transfer robot (not shown) arranged in the buffer chamber 3 and the robot arm 7 arranged in the atmospheric transfer unit 5. In this embodiment, the load lock chambers 4 are used as many as two.

Figure 2:
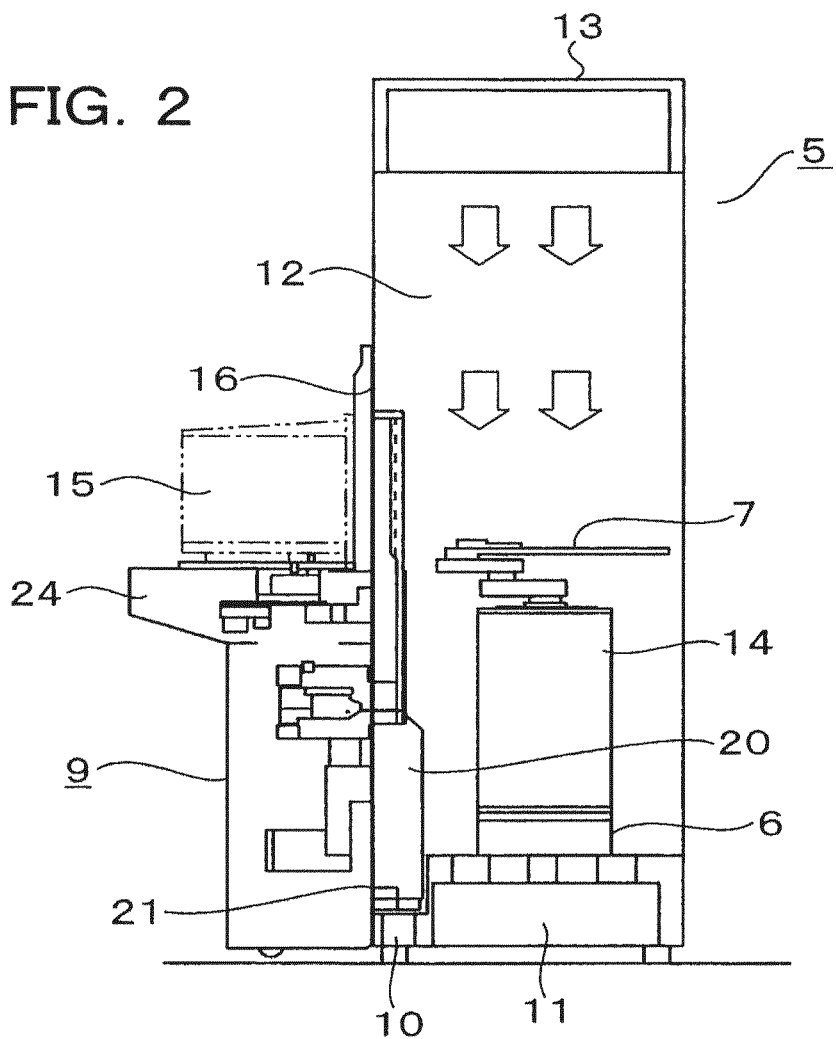
FIG. 2 is a side, vertical cross-sectional view of one of the load ports according to the one embodiment of the present invention and an atmospheric transfer unit in combination with which the load port is arranged.
Figure 3:
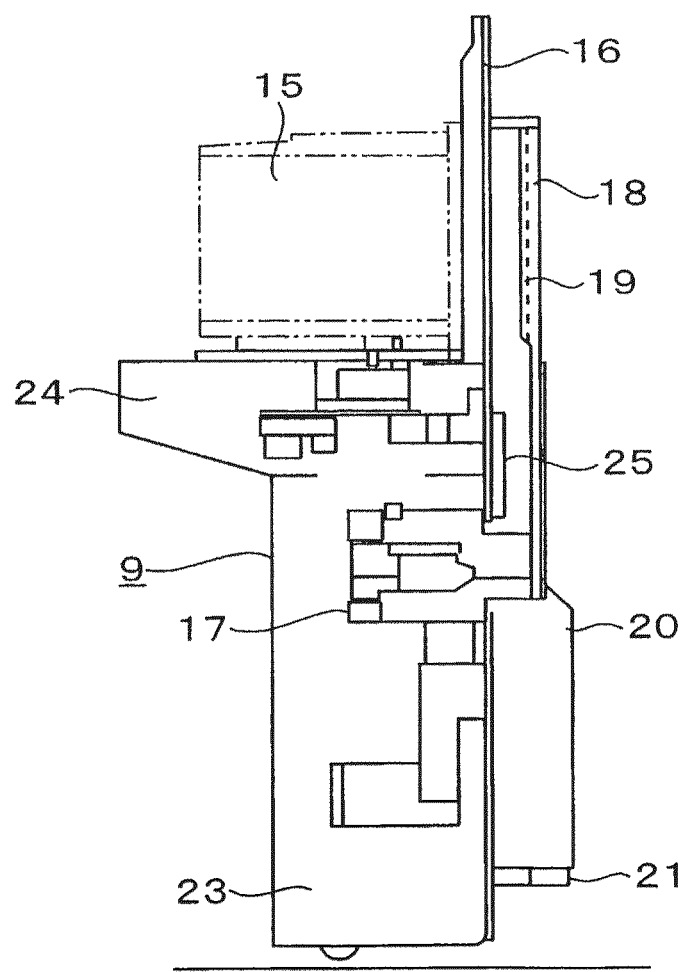
FIG. 3 is an enlarged, side, vertical cross-sectional view of one of the load ports according to the one embodiment of the present invention.
Figure 4:
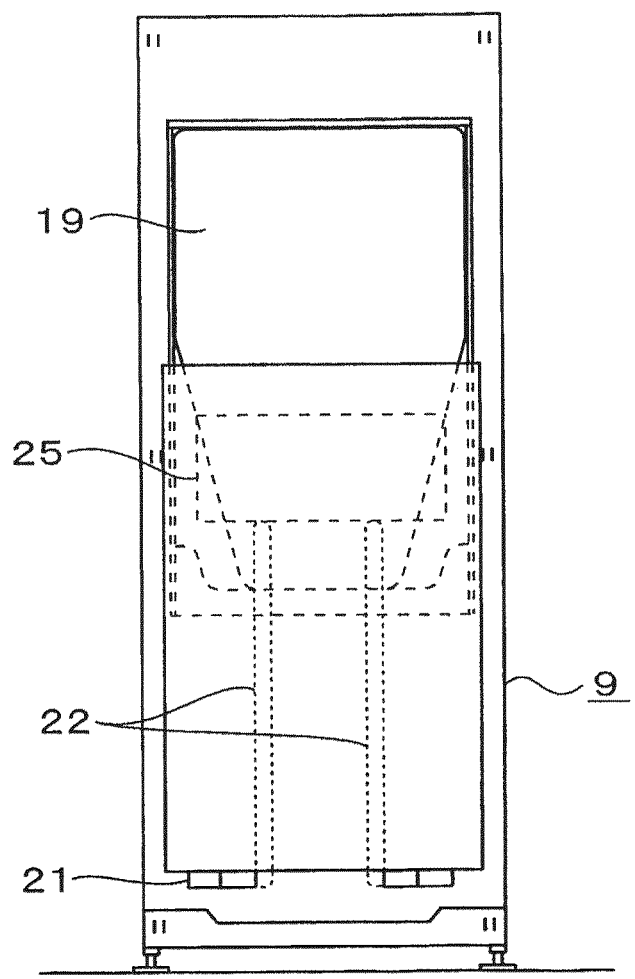
FIG. 4 is an enlarged, rear view of one of the load ports according to the one embodiment of the present invention.

Each load port 9 will hereinafter be described more specifically with reference to FIGS. 2, 3 and 4. As illustrated in FIG. 2, the atmospheric transfer unit 5 is internally provided with a transfer chamber 12, which serves as a space in which each semiconductor wafer is transferred under atmospheric pressure by the atmospheric transfer robot 14 equipped with the robot arm 7.

In an upper part of the transfer chamber 12, a fan unit 13 is arranged to produce a flow of air in a downward direction within the transfer chamber 12. In association with the fan unit 13, plural exhaust channels 11 are arranged below the atmospheric transfer robot 14 such that the air inside the transfer chamber 12 can be caused to downwardly flow from the interior of the transfer chamber 12 into the atmosphere as indicated by arrows.

This fan unit 13 serves to feed the air from the exterior of the atmospheric transfer unit 5 into the transfer chamber 12 and hence, to make the air pressure inside the transfer chamber 12 slightly higher than the atmospheric chamber.

As also illustrated in FIG. 1, the plural exhaust channels 11 are arranged in a lower part of the transfer chamber 12 and alongside the direction in which the load ports 9 are arranged side by side, in other words, along the direction in which the Y-axis unit 6 extends. Owing to the arrangement of the exhaust channels 11, the air inside the transfer chamber 12 is allowed to evenly flow in the downward direction. It is to be noted that, although the plural exhaust channels 11 are arranged in the illustrated atmospheric transfer unit 5, a single exhaust channel with a plurality of openings may be arranged and may be modified as needed in accordance with the specifications required.

Owing to the construction described in the above, a flow of air within the transfer chamber 12 is controlled to run in a substantially downward direction, and therefore, can serve to release and separate particles and processing gas, which have deposited on semiconductor wafers and are still remaining in the vicinities of the semiconductor wafers, respectively, and the like from the surfaces and vicinities of the semiconductor wafers.

Even when the door of the load port 9 is opened, the maintenance of the internal pressure of the transfer chamber 12 at a level slightly higher than the atmospheric pressure makes it possible to prevent the surrounding air of the atmospheric transfer unit 5 from flowing into the transfer chamber 12, and hence, to prevent contaminants, particles, foreign matter and the like from entering the transfer chamber 12 so that the system and semiconductor wafers are protected from adverse effects.

Owing to the above-described construction, it is also facilitated to produce within the container 15 an air flow useful for the movement and ventilation of particles and corrosive gas both of which exist within the container 15.

As illustrated in FIG. 2, each load port 9 according to this embodiment is arranged on the side of the atmosphere (on the left side as viewed in FIG. 2) relative to the transfer chamber 12 of the atmospheric transfer unit 5, and is provided with a Box Opener/Loader to Tool Standard (BOLTS) plate 16 such that the BOLTS plate 16 is located facing the transfer chamber 12. The BOLTS plate 16 is provided on the side of the transfer chamber 12 with a mapping unit 18, a door 19 and an exhaust duct 20, which are arranged along a surface of the BOLTS plate 16 as shown in detail in FIG. 3.

On the opposite side (outer side) of the BOLTS plate 16 relative to the transfer chamber 12, there are arranged an accommodation chamber 23 and a table unit 24 located above the accommodation chamber 23. Drive equipment for driving the load port 9 is accommodated in the accommodation chamber 23. The sealable container 15 with semiconductor wafers received therein, such as an FOUP, can be mounted on the table unit 24.

The BOLTS plate 16 is a plate which isolates the interior of the transfer chamber 12 of the atmospheric transfer unit 5 from the exterior, and has a surface facing the transfer chamber 12. The BOLTS plate 16 has, in an upper part thereof, an opening which is opened or closed by the door 19. This opening is formed at a level higher than the table 24 such that the opening is in registration with the position of the container 15 and is opposite to the container 15.

Accordingly, the semiconductor wafers either before or after their processing can be carried through the opening of the BOLTS plate 16, thereby making it possible to transfer the semiconductor wafers between the interior of the container 15 mounted on the table unit 24 and the transfer chamber 12. At this time, the door 19 is moved up or down by a drive unit 17 to close or open the opening formed in the upper part of the BOLTS plate 16. In this manner, the interior of the transfer chamber 12 and its exterior can be brought into communication with each other or can be shut off from each other.

In this embodiment, the load port 9 is provided on the side of the transfer chamber 12 with the exhaust duct 20, and a fan 21 is arranged on a lower portion of the exhaust duct 20. Arranged underneath the fan 21 is the corresponding one of the exhaust channels 10. The exhaust channel 10 has an opening. These exhaust duct 20, fan 21 and exhaust channel 10 make up an exhaust route on the side of the load port 9.

Similar to the exhaust channels 11, this exhaust channel 10 communicates the atmosphere around the atmospheric transfer unit 5 with the space inside the exhaust duct 20 so that by operating the fan 21, the air in the transfer chamber 12 can be caused to flow into the exhaust duct 20, through the exhaust duct 20, through the opening formed below the fan 21, toward the floor, and then to the exterior of the transfer chamber 12.

As the load port 9 according to this embodiment is provided on the rear side of the BOLTS plate 16 with the exhaust duct 20 and the fan 21, an air stream inside the transfer chamber 12 can be controlled on the side of the load port 9. The exhaust duct 20 is arranged such that an air stream vertically flows through its interior.

The exhaust duct 20 is configured to be attached to the BOLTS plate 16 by bolts. The exhaust duct 20 is dimensioned to avoid any interference with the drive unit 17 for the door 19, an open/closure unit for the door 19 or the mapping unit 18 upon its attachment.

The fan 21 is equipped with such fan capacity that, even when the door 19 is opened, no disturbance occurs in an air stream around the container 15 and a sufficient flow rate can also be obtained in the vicinity of the drive unit 17 to permit the exhaustion of air from the vicinity of the drive unit 17. Plural fans may, therefore, be arranged as needed in some instances.

The exhaust duct 20 has, in its wall (front wall) on the side of the accommodation chamber 23, slots 22 along which a carrier (not shown) for driving the door 19 and the mapping unit 18 is movable. The accommodation chamber 23, which is arranged on opposite side of the BOLTS plate 16 relative to the transfer chamber 12 and accommodates the drive unit 17 therein, and the interior of the exhaust duct 20 are, therefore, in communication with each other via the slots 22. By moving the carrier vertically in and along the slots 22, the mapping unit 18 and door 19 supported on the carrier are vertically moved.

In this embodiment, the slots 22 extend from the vicinity of the fan 21 in the exhaust duct 20 to a height around the middle of the BOLTS plate 16, and on the side of the transfer chamber 12, the slots 22 are covered by its wall (rear wall) of the exhaust duct 20 on the side of the transfer chamber 12.

When the fan 21 is operated, the air in the transfer chamber 12 flows into the exhaust duct 20 through an opening formed at an upper portion of the exhaust duct 20 and communicating the transfer chamber 12 and the interior of the exhaust duct 20 with each other, and at the same time, the air in the accommodation chamber 23 also flows into the exhaust duct 20 through the slots 22. The air from the transfer chamber 12 and the air from the accommodation chamber 23 then flow together through the exhaust channels 11, and finally flow out of the atmospheric transfer unit 5.

Corrosive gas, particles, contaminants and the like, which exist in the accommodation chamber 23, have separated and flowed in during the transfer of the semiconductor wafers, or have moved from the interior of the container 15, can therefore be caused to flow out of the atmospheric transfer unit 5.

To facilitate an efficient intake of particles and gas from the container 15, the exhaust duct 20 extends upwards to the vicinity of the lower extremity of the container 15 mounted on the upper wall of the table unit 24, and as described above, the opening is formed in the upper portion of the exhaust duct 20 so that the air in the transfer chamber 12 flows in through the opening. Further, one or more openings are also formed through the rear wall of the exhaust duct 20 at a height around the vertical center of the rear wall to facilitate an intake of air from a lower part of the transfer chamber 12.

To prevent corrosion with the corrosive gas, corrosion preventive coatings of a predetermined thickness are applied to a surface of the exhaust duct 20, a surface of the fan 21 and a surface of the carrier supporting thereon the door 19 of the load port 9.

As described above, the BOLTS plate 16 serves to isolate the transfer chamber 12 of the atmospheric transfer unit 5 from the exterior. In addition, a closure plate 25 is arranged between the BOLTS plate 16 and the downwardly-moved door 19. The closure plate 25 serves to prevent the internal atmosphere of the transfer chamber 12 of the atmospheric transfer unit 5 from flowing into the accommodation chamber 23, in which the drive unit 17 of the load port 9 is accommodated, even when the door 19 is moved downwards to open the opening of the load port 9.

According to this embodiment, an air stream can be produced inside the container 15 without production of turbulence in the transfer chamber 12 of the atmospheric transfer unit 5 even when the door 19 of the load port 9 is opened. It is, therefore, possible to prevent the deposition of particles and the development of corrosion inside the container 15 or in the vicinities of the place where the container 15 is arranged and also to prevent the deposition of particles and the development of corrosion on the drive unit positioned within the accommodation chamber 23.

Since an air stream can be produced inside the container 15 without production of turbulence inside the transfer chamber 12 of the atmospheric transfer unit 5 as described above, the load port 9 according to this embodiment can lessen or resolve the above-described problems of the conventional art without requiring any additional arrangement of large equipment such as the arrangement of a local ventilator in the transfer chamber 12 of the atmospheric transfer unit 5, and hence, without requiring any substantial additional cost.

The invention claimed is:

1. A method of preventing corrosion in a load port provided with a transfer chamber, the load port comprising:
   a table on which a container containing a piece of material is mounted;
   an isolating portion vertically extending and isolating an interior of the transfer chamber from an exterior of the transfer chamber;
   an opening formed in the isolating portion, a robot in the transfer chamber transferring the piece of material between the container and the transfer chamber through the opening;
   a door that opens or closes the opening from a side of the interior of the transfer chamber;
   a drive unit that is arranged under the table at the exterior of the transfer chamber and moves the door for opening or closing the opening;
   an accommodation chamber that is arranged under the table at the exterior of the transfer chamber and accommodates the drive unit;
   a slot formed in the isolating portion below the opening, the slot being located between the accommodation chamber and the interior of the transfer chamber, the drive unit in the accommodation chamber being linked to the door through the slot,
   a cover that is fixed to the isolating portion below the opening so as to cover the slot at the side of the interior of the transfer chamber and form a space between the cover and the isolating portion, an upper end of the cover being open; and
   a fan arranged in a lower portion of the cover,
   the method comprising:
   starting to drive the fan;
   flowing gas containing corrosive gas in the interior of the transfer chamber into the space through the upper end of the space;
   sucking an atmosphere in the accommodation chamber into the space through the slot by driving the fan; and
   exhausting the gas and the atmosphere from the space by driving the fan.

2. The method according to claim 1, wherein the gas and the atmosphere are exhausted from the space to an exterior of the transfer chamber in the exhausting step.

3. The method according to claim 1, wherein the space is under a pressure lower than a pressure in the accommodation chamber by driving the fan in the sucking step.

4. The method according to claim 1, wherein the space is under a pressure lower than a pressure in the transfer chamber and a pressure in the accommodation chamber by driving the fan in the sucking step.

5. A load port provided with a transfer chamber, comprising:
   a table on which a container containing a piece of material is mounted;
   an isolating portion vertically extending and isolating an interior of the transfer chamber from an exterior of the transfer chamber;
   an opening formed in the isolating portion, a robot in the transfer chamber transferring the piece of material between the container and the transfer chamber through the opening;
   a door that opens or closes the opening from a side of the interior of the transfer chamber;
   a drive unit that is arranged under the table at the exterior of the transfer chamber and moves the door for opening or closing the opening;
   an accommodation chamber that is arranged under the table at the exterior of the transfer chamber and accommodates the drive unit;
   a slot formed in the isolating portion below the opening, the slot being located between the accommodation chamber and the interior of the transfer chamber, the drive unit in the accommodation chamber being linked to the door through the slot,
   a cover that is fixed to the isolating portion below the opening so as to cover the slot at the side of the interior of the transfer chamber and form a space between the cover and the isolating portion, an upper end of the cover being open; and
   a fan configured to suck an atmosphere in the accommodation chamber into the space through the slot.

6. The load port according to claim 5, further comprising a plate member fixed to the isolating portion below the opening,
   wherein the drive unit moves the door between a first position and a second position,
   the door in the first position closes the opening,
   the door in the second position opens the opening, and
   the plate member is arranged between the isolating portion and the door in the second position.

7. The load port according to claim 5, wherein a corrosion-preventive coating is applied to at least one of a surface of the cover or a surface of the fan.

8. The method according to claim 1, further comprising:
a first moving step of moving the door from a first position to a second position, the door in the first position closing the opening, the door in the second position opening the opening; and
a second moving step of moving the door from the second position to the first position,
wherein in the second moving step, a plate member fixed to the isolating portion below the opening is between the door in the second position and the isolating portion.

9. The method according to claim 1, wherein the upper end of the space is open so as to always communicate the space with the interior of the transfer chamber through the upper end of the space.

10. The load port according to claim 5, wherein the cover includes:
a pair of side walls fixed to the isolating portion; and
a vertical wall between the pair of side walls, the vertical wall being opposed to the isolating portion.

11. The load port according to claim 10, wherein the vertical wall includes an upper portion and a lower portion, and
a distance between the upper portion of the vertical wall and the isolating portion is shorter than a distance between the lower portion of the vertical wall and the isolating portion.

12. The load port according to claim 5, wherein the cover includes a lower end which is above a lower end of the isolating portion.

13. The load port according to claim 12, wherein the fan is arranged at the lower end of the cover.

* * * * *